US010789560B2

(12) United States Patent
Mendiola et al.

(10) Patent No.: US 10,789,560 B2
(45) Date of Patent: Sep. 29, 2020

(54) SYSTEM FOR TRACKING HAULING OPERATIONS

(71) Applicant: TAC Insight, LLC, Knoxville, TN (US)

(72) Inventors: Michael J Mendiola, West, TX (US); Steven B Rasmussen, Knoxville, TN (US)

( * ) Notice: Subject to any disclaimer, the term of this patent is extended or adjusted under 35 U.S.C. 154(b) by 485 days.

(21) Appl. No.: 15/086,735

(22) Filed: Mar. 31, 2016

(65) Prior Publication Data

US 2016/0292619 A1 Oct. 6, 2016

Related U.S. Application Data

(60) Provisional application No. 62/140,634, filed on Mar. 31, 2015.

(51) Int. Cl.
*H04W 40/24* (2009.01)
*G06Q 10/06* (2012.01)
*H04W 4/80* (2018.01)
*H05K 7/00* (2006.01)

(52) U.S. Cl.
CPC ...... *G06Q 10/063114* (2013.01); *H04W 4/80* (2018.02); *H04W 40/244* (2013.01); *H05K 7/00* (2013.01)

(58) Field of Classification Search
USPC ...................................................... 705/7.15
See application file for complete search history.

(56) References Cited

U.S. PATENT DOCUMENTS

| 7,246,009 B2 | 6/2007 | Hamblen et al. |
| 7,878,392 B2 | 2/2011 | Mayers et al. |
| 8,626,541 B2 | 1/2014 | Doan et al. |
| 2005/0171692 A1* | 8/2005 | Hamblen ............... G07C 5/085 701/468 |
| 2009/0063222 A1* | 3/2009 | Doan ..................... G06Q 10/00 705/7.13 |

(Continued)

OTHER PUBLICATIONS

Blom et al. (Autonomous Hauler Loading, Jonatan Blom, Mälardalen University, School of Innovation, Design and Engineering, Available Digitala Vetenskapliga Arkivet (DiVA), on Nov. 25, 2013).*

*Primary Examiner* — Matthew D Henry
(74) *Attorney, Agent, or Firm* — Matthew M. Googe; Robinson IP Law, PLLC

(57) ABSTRACT

A method of tracking a hauling operation is provided. The method includes the steps of: mounting a beacon to a hauler, the beacon including a transmitter configured to emit a low energy transmission including a unique identification, the unique identification code corresponding to the beacon; providing at least a first receiving unit at the loading site, the first receiving unit configured to detect the low energy transmission emitted by the beacon mounted to the hauler; detecting with the first receiving unit the low energy transmission emitted by the beacon when the hauler and mounted beacon are within range of the first receiving unit; analyzing the detected transmission emitted by the beacon mounted to the hauler with the at least first receiving unit to determine the unique identification code transmitted by the beacon; and identifying the hauler based on the embedded unique identification code of the detected transmission.

17 Claims, 13 Drawing Sheets

(56) References Cited

U.S. PATENT DOCUMENTS

2012/0098654 A1\* 4/2012 Ebert ..................... E02F 9/24
340/438
2012/0112895 A1\* 5/2012 Jun ..................... G01S 5/0247
340/435

\* cited by examiner

SYSTEM FOR TRACKING HAULING OPERATIONS

CROSS-REFERENCE TO RELATED APPLICATION

This application claims priority to U.S. Provisional Patent Application Ser. No. 62/140,634 to Mike Mendiola and Steve Rasmussen for a "System for Tracking Hauling Operations" which was filed on Mar. 31, 2015, the contents of which are incorporated herein by reference in its entirety.

FIELD

This disclosure relates to the field of hauling and loading operations. More particularly, this disclosure relates to a system for managing and tracking loading and hauling operations.

BACKGROUND

Loading, hauling, and unloading materials often requires careful planning to coordinate picking up the load at a loading site or other source of material location and transporting the load to a worksite or other location. Information from the loading site, hauler, and worksite are typically all maintained separately, thereby making it difficult to track an overall progress of a particular job. Specifically, material suppliers, haulers, contractors, and independent haulers are all often separate entities maintaining separate and independent records related to each party's operations.

Further, information related to a particular load being transported, such as load weight and type of material may also be maintained separately from information related to the loading site, hauler, and worksite. For example, when a truck has picked up a load and is leaving a loading site, that truck is typically weighed and issued a physical weighticket, which must then be manually processed.

Because information related to each step of the process of loading, hauling, and unloading materials is maintained separately, it is difficult to reconcile this information in a single location and to otherwise provide overall information related to multiple haulers at both a quarry or loading location and a worksite or unloading location. Because reconciliation is challenging, often it is difficult to provide overall information regarding the status of one or more haulers and the loads being transported by those haulers. Further, lack of information also gives rise to opportunities for fraud, such as when one or more loads are stolen or otherwise diverted from a particular job.

Attempts have been made to track certain aspects of equipment within a particular location, these attempts typically have been performed using tags and equipment that require substantial infrastructure to be installed at the location, such as tag readers and network components linking tag readers with various other systems. Similarly, equipment must be substantially modified to accept components with existing systems. These attempts make deployment difficult given the costs and requirements associated with installing the required infrastructure. Further, it may be difficult, if not impossible, to install required infrastructure for these systems at locations that are remote or otherwise lack infrastructure necessary to support the system.

What is needed, therefore, is a system for tracking hauling operations and for marrying information related to each party involved in a hauling operation that is readily deployable without requiring substantial infrastructure at a desired site.

SUMMARY

The above and other needs are met by system and method of tracking a hauling operation that is readily deployable without requiring substantial infrastructure at a desired site. In a first aspect, a method is provided including the steps of: mounting a beacon to a hauler, the beacon including a transmitter configured to emit a low energy transmission including a unique identification code embedded in the low energy transmission, the unique identification code corresponding to the beacon; providing at least a first receiving unit at the loading site, the first receiving unit configured to detect the low energy transmission emitted by the beacon mounted to the hauler; detecting with the first receiving unit the low energy transmission emitted by the beacon when the hauler and mounted beacon are within range of the first receiving unit; analyzing the detected transmission emitted by the beacon mounted to the hauler with the at least first receiving unit to determine the unique identification code transmitted by the beacon; and identifying the hauler based on the embedded unique identification code of the detected transmission.

In one embodiment, the method further includes the steps of assigning a status position to the hauler based on a location of the hauler and changing a status of the hauler to a designation that the hauler is located within the loading site when the at least first receiving unit detects the low energy transmission emitted by the beacon mounted to the hauler.

In another embodiment, the method further includes providing a display mounted to a loader operating within the loading site and displaying the status of the hauler on the display mounted to the loader.

In yet another embodiment, the method further includes displaying a list of haulers that have a status indicating the haulers are located within the loading site.

In one embodiment, the method further includes analyzing the detected transmission emitted by the beacon mounted to the hauler with the at least first receiving unit to measure a strength of the detected transmission and calculate a distance to the beacon; and filtering the list of haulers displayed on the loader to include only those haulers that are within a desired range of the loader.

In another embodiment, the method includes sorting the list of haulers displayed on the display of the loader based on a determined distance of each hauler from the loader.

In yet another embodiment, the method includes providing a user interface on the display mounted to the loader, the user interface configured to receive user input; receiving user input from an operator of the loader; changing a status of a hauler based on the received operator input to designate that the hauler has been loaded by the loader; and recording information related to a time and date of receiving operator input related to a loading.

In one embodiment, the method includes receiving load input from the operator of the user corresponding to an amount and type of material loaded by the loader into the hauler. In another embodiment, receiving an electronic load ticket on a hauler device, the electronic load ticket including information related to an identity of the hauler and load input received from the operator of the loader. In yet another embodiment, receiving user input from an operator of the loader such that the hauler status is updated to reflect that the hauler has departed the loader and is en route to a delivery site.

In one embodiment, the method includes updating a status of a hauler to reflect that the hauler has departed the loading site for a delivery site when the at least first receiving unit detects the low energy transmission emitted by the hauler beacon for at least a second time.

In another embodiment, the method includes providing a GPS unit mounted to the hauler; transmitting a location of the hauler between the loading site and the delivery site.

In yet another embodiment, the method includes providing a second receiving unit at a delivery site, the second receiving unit configured to detect the low energy transmission emitted by the beacon mounted to the hauler; detecting with the second receiving unit the low energy transmission emitted by the beacon when the hauler and mounted beacon are within range of the first receiving unit; and updating a status of the hauler to reflect that the load transported by the hauler has been delivered to the delivery site.

In one embodiment, the method includes receiving an updated electronic load ticket on the hauler device reflecting that the load has been delivered.

In a second aspect, a method of tracking hauling operations within a loading site, the method including the steps of: providing a hauler tracking database in communication with a network; storing data on the hauler tracking database related to an identity of a hauler; storing a unique identification code on the database associated with the hauler, the unique identification code corresponding to a beacon mounted to the hauler that is configured to actively emit a low energy transmission including the unique identification code embedded in the low energy transmission; receiving an arrival transmission on the hauler tracking database from one or more receiving units located at a loading site and in electronic communication with the network, the arrival transmission including the unique identification code emitted by the beacon; determining an identity of the hauler based on the unique identification code received on the hauler tracking database; storing a status of the hauler on the hauler tracking database indicating that the hauler is located at a loading site; transmitting the status and identifying information of the hauler over the network to a display of a loader receiving unit mounted to a loader at the loading site; receiving a load transmission on the hauler tracking database from the loader receiving unit including the unique identification code and indicating that the hauler has been loaded by the loader; updating the status of the hauler on the hauler tracking database indicating that the hauler has been loaded; receiving a departure transmission on the hauler tracking database from the one or more receiving units, the departure transmission including the unique identification code emitted by the beacon; and updating the status of the hauler on the hauler tracking database indicating that the hauler has departed the loading site.

In one embodiment, the method further includes generating an electronic load ticket on the hauler tracking database based on data received from the loader receiving unit and transmitting the electronic load ticket to a hauler device.

In another embodiment, receiving a delivery site arrival transmission on the hauler tracking database from one or more receiving units located at a delivery site, the delivery site transmission including the unique identification code emitted by the beacon; and updating the status of the hauler on the hauler tracking database indicating that the hauler has arrived at the delivery site.

In yet another embodiment, the method includes receiving location data corresponding to a location of the hauler as the hauler travels between the loading site and delivery site.

In a third aspect, a system for tracking hauling operations at a loading site including: a beacon mounted to a hauler, the beacon including a transmitter configured to actively emit a low energy transmission including a unique identification code embedded in the low energy transmission; at least a first receiving unit located at the loading site, the first receiving unit including a receiver element for detecting a low energy transmission emitted from the beacon; a database in communication with the at least first receiving unit, the database configured to store data related to the beacon and the hauler, the database further configured to association data related to the beacon and the hauler with weigh ticket information for a particular load transported by the hauler; wherein data stored on the database is updated when the beacon attached to the hauler is detected by one of the plurality of receiving units.

In one embodiment, the low energy transmission emitted from the beacon comprises a Bluetooth® LE transmission.

BRIEF DESCRIPTION OF THE DRAWINGS

Further features, aspects, and advantages of the present disclosure will become better understood by reference to the following detailed description, appended claims, and accompanying figures, wherein elements are not to scale so as to more clearly show the details, wherein like reference numbers indicate like elements throughout the several views, and wherein:

FIGS. 2 and 3 show interfaces of the plurality of receiving units according to one embodiment of the present disclosure;

Figure 18:
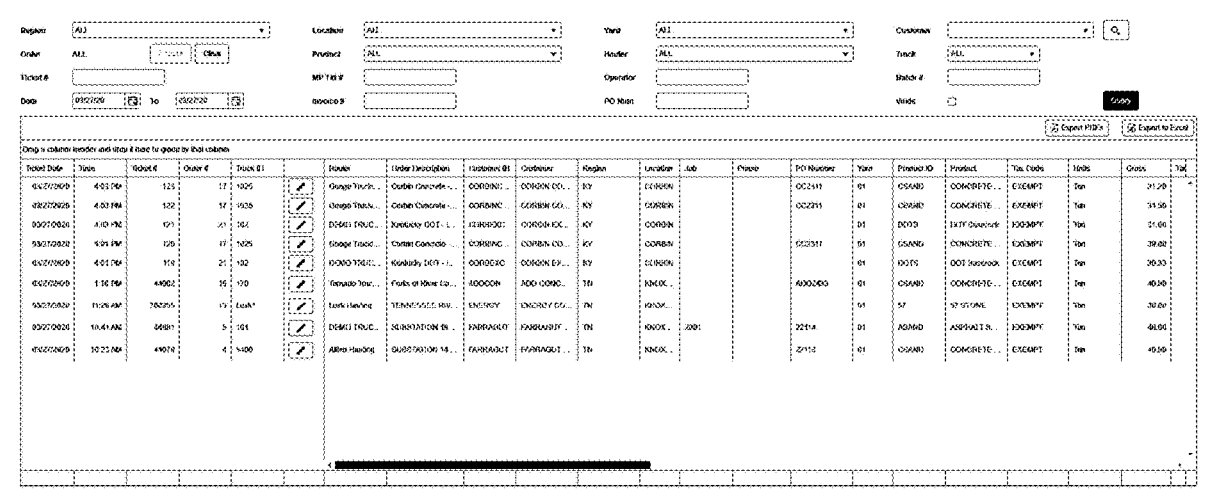

FIGS. 17 and 18 show a user interface of a system for tracking hauling operations according to one embodiment of the present disclosure.

DETAILED DESCRIPTION

Various terms used herein are intended to have particular meanings. Some of these terms are defined below for the purpose of clarity. The definitions given below are meant to cover all forms of the words being defined (e.g., singular, plural, present tense, past tense). If the definition of any term below diverges from the commonly understood and/or dictionary definition of such term, the definitions below control.

Figure 1:
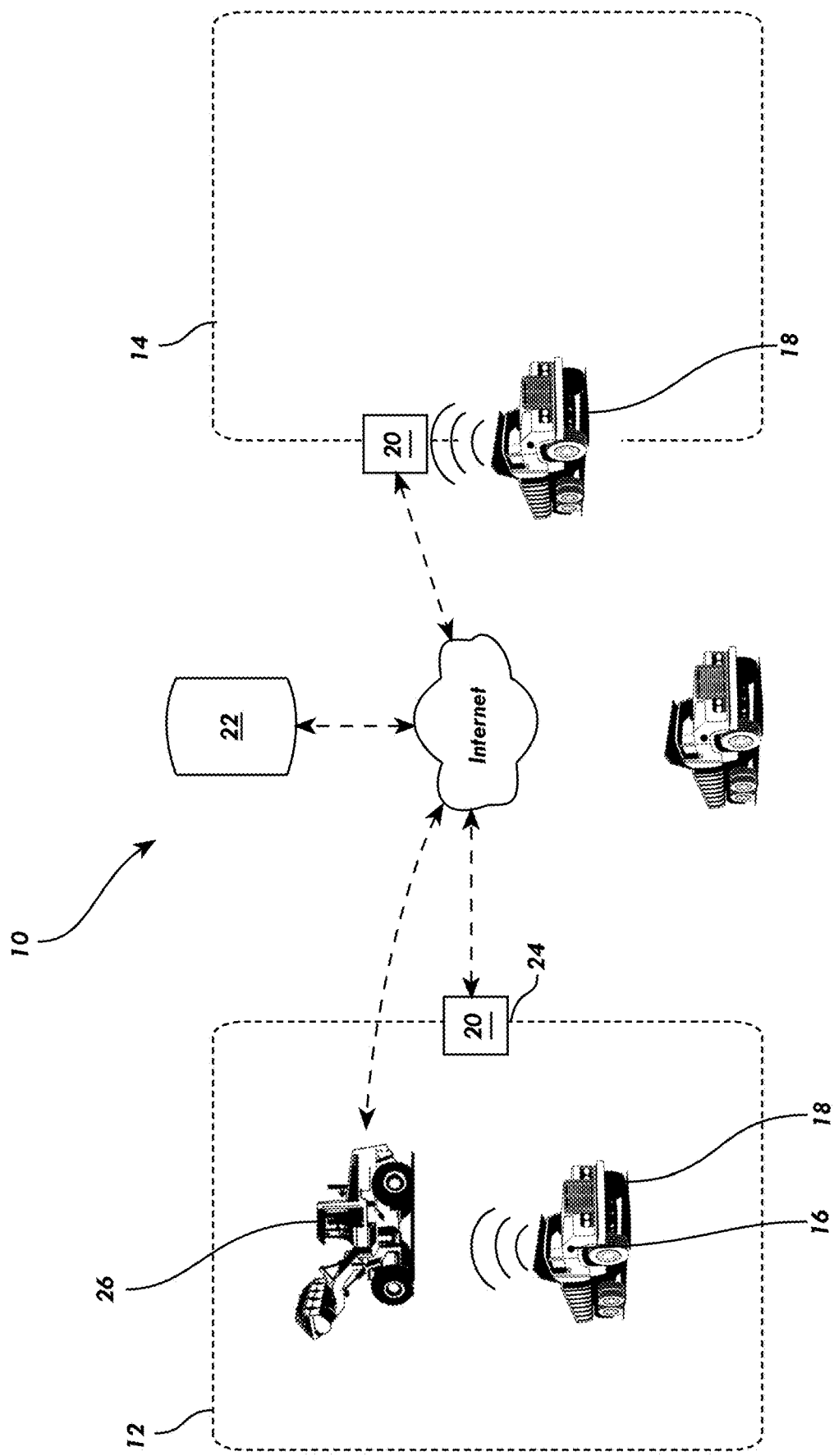
FIG. 1 shows a system for tracking hauling operations according to one embodiment of the present disclosure.

FIG. 1 illustrates a system for tracking hauling operations 10 between a loading site 12 and a worksite 14, the system including a beacon 16 attached to a hauler 18, a plurality of receiving units 20 located at the loading site 12 and worksite 14, and a database 22 in communication with the plurality of receiving units 20. The system for tracking hauling operations 10 is configured to track a status of a hauler 18 and a load being transported by the hauler 18 as it is loaded at a loading site 12, transported to a worksite 14, and delivered to the worksite 14. Further, the system for tracking hauling operations 10 is configured to reconcile information related to the hauler with other information related to a particular load, such as scale weigh-ticket information and update information related a status and location of the hauler.

The beacon 16 includes a transmitter such that the beacons 16 transmit a unique identification code of the beacon 16. The transmitter is preferably one of Bluetooth™ or Bluetooth Low Energy transmitters (commonly referred to as Bluetooth LE™ or Bluetooth Smart™), such that the beacon 16 is readily communicable with one or more observing devices configured to detect a transmission from the beacon 16. Various beacons 16 that may be suitable for use with the system for tracking hauling operations include beacons available from Gelo™, iBeek™, Beeks™, and other like products. While the transmitter is preferably a Bluetooth™ or BlueTooth LE™ transmitter, it is also understood that various other transmitters may be suitable, such as various transmitters for providing a short-range radio transmission or for being detectable by a receiver when in proximity to the receiver.

The beacon 16 is attached to a hauler 18, such as to an exterior of the hauler 18 such that a transmission emitted by the beacon 16 is relatively unobstructed. In one example, the beacon 16 may be placed in a substantially weatherproof housing, wherein the housing includes a magnet, adhesive, or fasteners, thereby making the beacon 16 easily and removably attachable to various haulers 18. Alternatively, the beacon 16 may be substantially permanently secured to or integrated into the hauler 18. As referred to herein, a hauler 18 refers to a type of vehicle capable of transporting a material or other cargo. For example, the hauler 18 may be a dump truck or flat bed truck capable of hauling bulk materials such as aggregate.

The beacon 16 is configured to broadcast a short-range radio transmission. A range of the beacon 16 may vary based on a type of transmitter used and desired range of the beacon. The beacon 16 broadcasts an identifier, such as a unique identification code associated with the beacon 16.

Referring again to FIG. 1, a plurality of receiving units 20 are provided for detecting and receiving information from the beacon 16 when one of the plurality of receiving units 20 is within a range of the broadcasted signal from the beacon 16. The receiving units 20 are configured to detect transmissions emitted by the beacons 16 including the unique identification code transmitted by the beacon 16 when the beacon 16 is within a designated range of the receiving units 20. In one embodiment, the receiving units 20 preferably include a processor, memory, and a display. For example, the receiving units 20 may be a laptop, tablet, smartphone, or other like device, and may further include a GPS module and a communication module (e.g. cellular radio or other wireless communication protocols) for wirelessly communicating with the database 22 as discussed in more detail below. In some embodiments, one or more of the receiving units 20 may simply read or detect a transmission from the beacon 20 when the beacon is within a designated range of the receiving unit 20, such that some of the receiving units 20 may not require displays or other various components.

The plurality of receiving units 20 are preferably positioned at locations throughout the loading site 12 and the worksite 14. A receiving unit 20 is preferably positioned adjacent an entrance 24 to the loading site 12 (FIG. 1), and may be formed as a freestanding kiosk or other like structure. Alternatively, the receiving unit 20 may be attached or built-in to structures or existing components of the worksite 14, such as to scales, entrance gates, signs, and other various locations. Similarly, some of the plurality of receiving units 20 may be placed throughout a worksite 14, such as at an entrance to the worksite 14, a designated area where materials are desired, and at other locations of interest in the worksite 14. Further, one of the plurality of receiving units 20 is secured within a cab of a loader 26, and additional of the plurality of receiving units 20 may be secured within a cab of the hauler 18.

Each of the plurality of receiving units 20 may be configured to perform a different task based on a location of the receiving units 20. For example, a receiving unit secured within a cab of a loader 26 may be configured to read orders and truck dispatches communicated to the receiving unit and to read beacons assigned to a hauler 18. The receiving unit secured within the cab of a loader generates load ticket data and communicates the generated data to the database. The receiving unit 20 may optionally be configured to print a ticket on-site. When a wireless connection is unavailable, the receiving unit 20 may be configured to store data on the receiving unit 20 until a connection is re-established.

In another example, a receiving unit 20 within a cab of the hauler 18 may be configured with an interface to communicate data related to the hauler and display information to a driver of the hauler 18. When the loader 26 generates a ticket related to a load being loaded by the loader, the receiving unit 20 of the hauler 18 may display a notification that the hauler 18 has been loaded. Additional optional information may be displayed to a driver such as real-time tracking data and GPS directions to a designate job or delivery site.

While the above description contemplates attaching a beacon 16 to a hauler 18 and detecting the beacon 16 with the plurality of receiving units 20, it is also understood that one of the plurality of receiving units 20 may be secured to the hauler 18, and multiple beacons 16 placed through the loading site 12 and worksite 14 such that a receiving unit 20 secured to the hauler 18 detects transmissions from the multiple beacons 16 as the hauler 18 passes within a designated range of the beacons 16.

With further Reference to FIG. 1, the plurality of receiving units 20 are in communication with a database 22. The database 22 is configured to store information related to the beacon 16, hauler 18, loader 26, and various other information related to assets and activities within the worksite 14 and loading site 12. For example, the database 22 may store information related to an identity of a hauler 18 and associate that hauler 18 to a particular unique identification code of the beacon 16. The database 22 may also store or retrieve information related to other information corresponding to a particular loading site 12 or worksite 14, such as weigh-tickets issued to a hauler at a scale.

The database 22 may include one or more of memory, a processor, and various other components for storing information related to assets of the loading site 12 or worksite 14. The database 22 may be located at one or more of the loading site 12 or worksite 14, or may further be located at a location that is distant from the loading site 12 and worksite 14. The database 22 may be formed of components at various locations, such as a cloud-based database.

As illustrated in FIG. 1, the plurality of receiving units 20 are in communication with the database 22, such as via the Internet. For example, the plurality of receiving units 20 may be in wireless communication with the database 22 via a cellular or other wireless connection. In alternative embodiments, data collected by the plurality of receiving units 20 may be stored on the receiving units 20 when communication with the database 22 may not be available and later transmitted to the database 22 when communication with the database 22 is later available.

The system for tracking hauling operations 10 is configured to track assets within the loading site 12 and worksite 14, such as loading, transport, and delivery of a material from the loading site 12 to the worksite. Further, the system for tracking hauling operations 10 enables a status of assets within the loading site 12 and worksite 14 to be readily updated without requiring substantial manual input from one or more operators of assets within the loading site 12 and worksite 14. The system for tracking hauling operations 10 determines when a beacon 16 associated with a particular hauler 18 is within a designated range of the plurality of receiving units 20. When a hauler 18 enters a loading site 12, a beacon 16 attached to the hauler 18 is detected by a receiving unit 20 adjacent the entrance of the loading site 12. Similarly, when a hauler 18 is detected within a designate range of a particular receiving unit 20, such as a receiving unit 20 mounted to a loader 26, an operator of the loader 26 may view information related to the hauler 18 such as a load to be transported by the hauler 18. Other information may be measured and stored with respect to a hauling operation, such as the amount of time a particular asset spends at a loading site or at a worksite, or an amount of time required to load a hauler.

Figure 2:
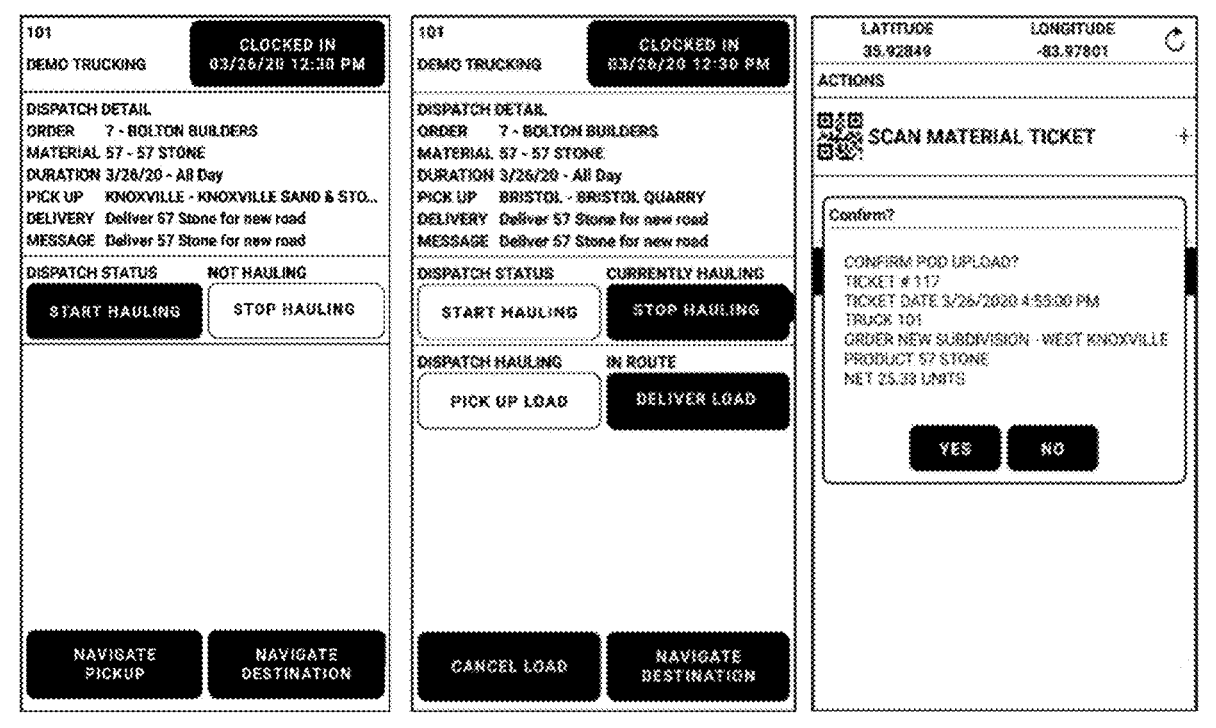

FIG. 2 illustrates an interface of a receiving unit 20 of the present system for a receiving unit 20 mounted in a hauler 18 in which information related to the particular hauler 18 is displayed including identification of the hauler, capacity of the hauler, and other related information. An operator of the hauler 18 may designate that the hauler 18 is picking up a new load at a loading site 12 to be transported to a worksite 14. After beginning a new load, FIG. 2 also illustrates a display indicating that a load is in progress and enables an operator of the hauler 18 to perform various actions such as designate that delivery of a load is complete or to cancel a particular load. An interface of a receiving unit 20 mounted in a hauler 18 may display additional information to an operator of the hauler 18, such as a type of load to be picked up, directions to various locations such as a location of materials to be picked up and a worksite for dropping off the materials, and information related to a weigh ticket issued to the hauler 18.

Figure 3:
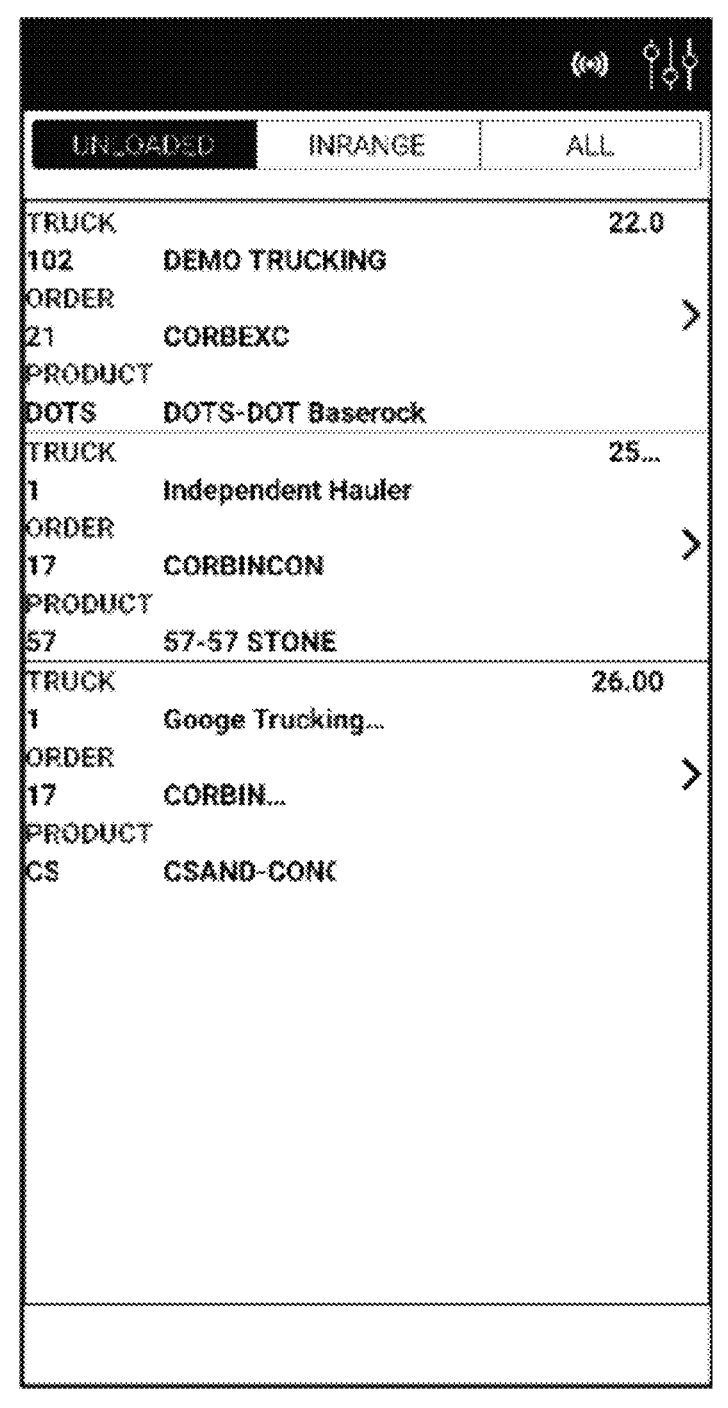

FIG. 3 illustrates an interface of a receiving unit 20 mounted in a loader 26, and specifically lists multiple beacons 16 associated with multiple haulers 18 detected within range of the receiving unit of the loader 26. When multiple haulers 18 and their associated beacons 16 are detected within range of the receiving unit, each of the haulers 18 is displayed in a list including information such as an identification of the hauler 18, an order corresponding to the hauler 18, and a material to be loaded onto the hauler 18. An interface of a receiving unit 20 mounted in a loader 26 may display various information to an operator of the loader 26 such as a type of load to be loaded on to a particular hauler 18, an amount of a particular load to be loaded, and various alerts, such as an alert to an operator of the loader 26 that a particular truck has entered the loading site 12 or is near the loading site 12, thereby allowing the operator to prepare to load the hauler 18 in advance of the hauler 18 arriving.

In one embodiment, the interface of the receiving unit on the loader may display a list of all haulers for a particular project. Alternatively, the list may include only haulers that have been detected as having entered the loading site. The list may be sorted such that any haulers that are in proximity to the loader such that the receiving unit on the loader detects the low energy transmission emitted from the beacon on the hauler are displayed at a top of the list. If multiple haulers are detected as being in proximity, the haulers may be sorted based on a distance of the haulers from the loader as determined by a determined distance from the receiving unit to the beacon of each hauler.

Figure 4:
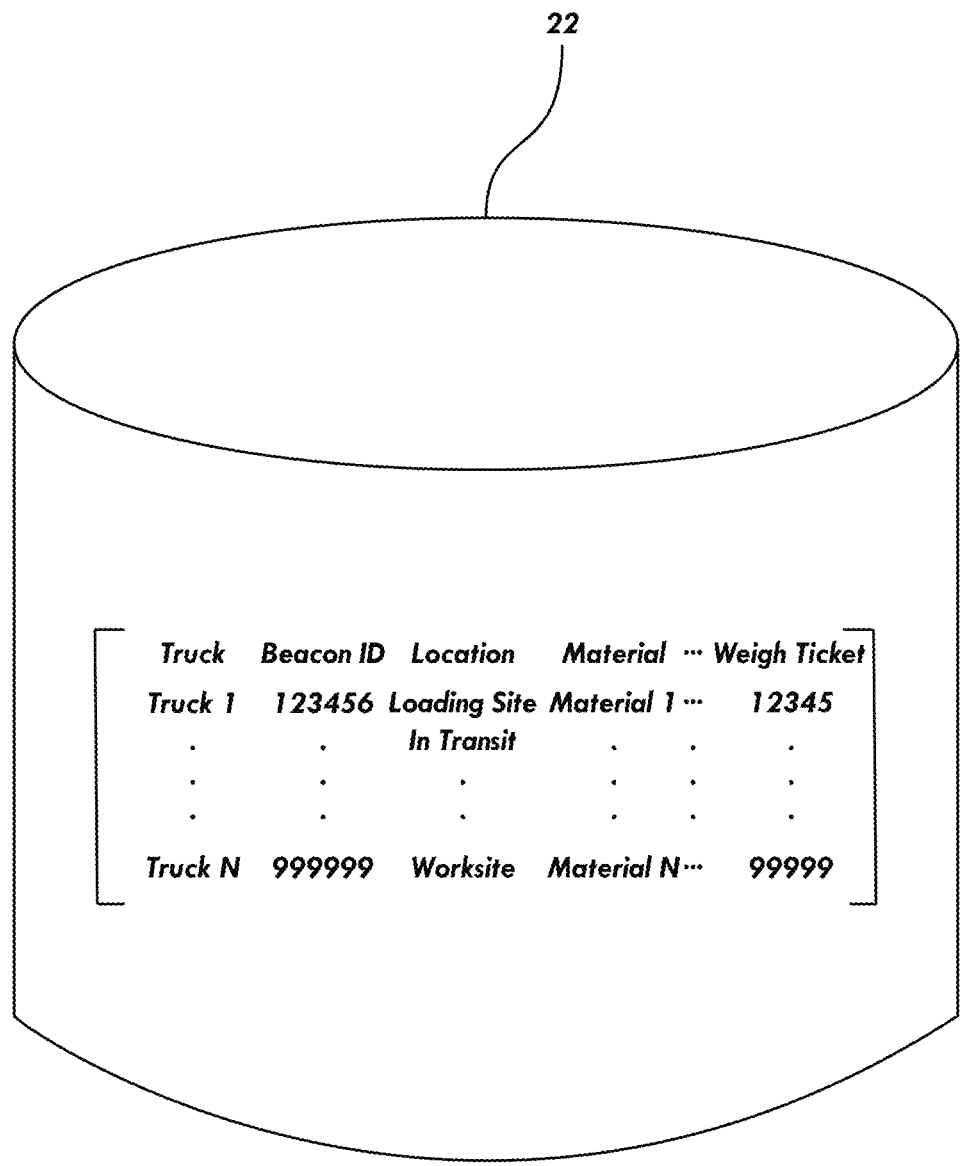
FIG. 4 illustrates a database of a system for tracking hauling operations according to one embodiment of the present disclosure.

The system 10 further enables data related to weigh tickets to be stored on the database 22 and associated with a particular hauler 18. For example, the system for tracking hauling operations 10 may receive information related to a weigh ticket issued to a hauler, such as a weigh ticket issued at a loading site 12 after weighing a hauler 18 that has received a load of materials at the loading site. Information related to a weigh ticket and other data are associated with a particular hauler 18, as illustrated in FIG. 4. Other various information may be stored on the database 22, such as information related to one or more loaders 26 and other assets within the loading site 12 or worksite 14.

Figure 5:
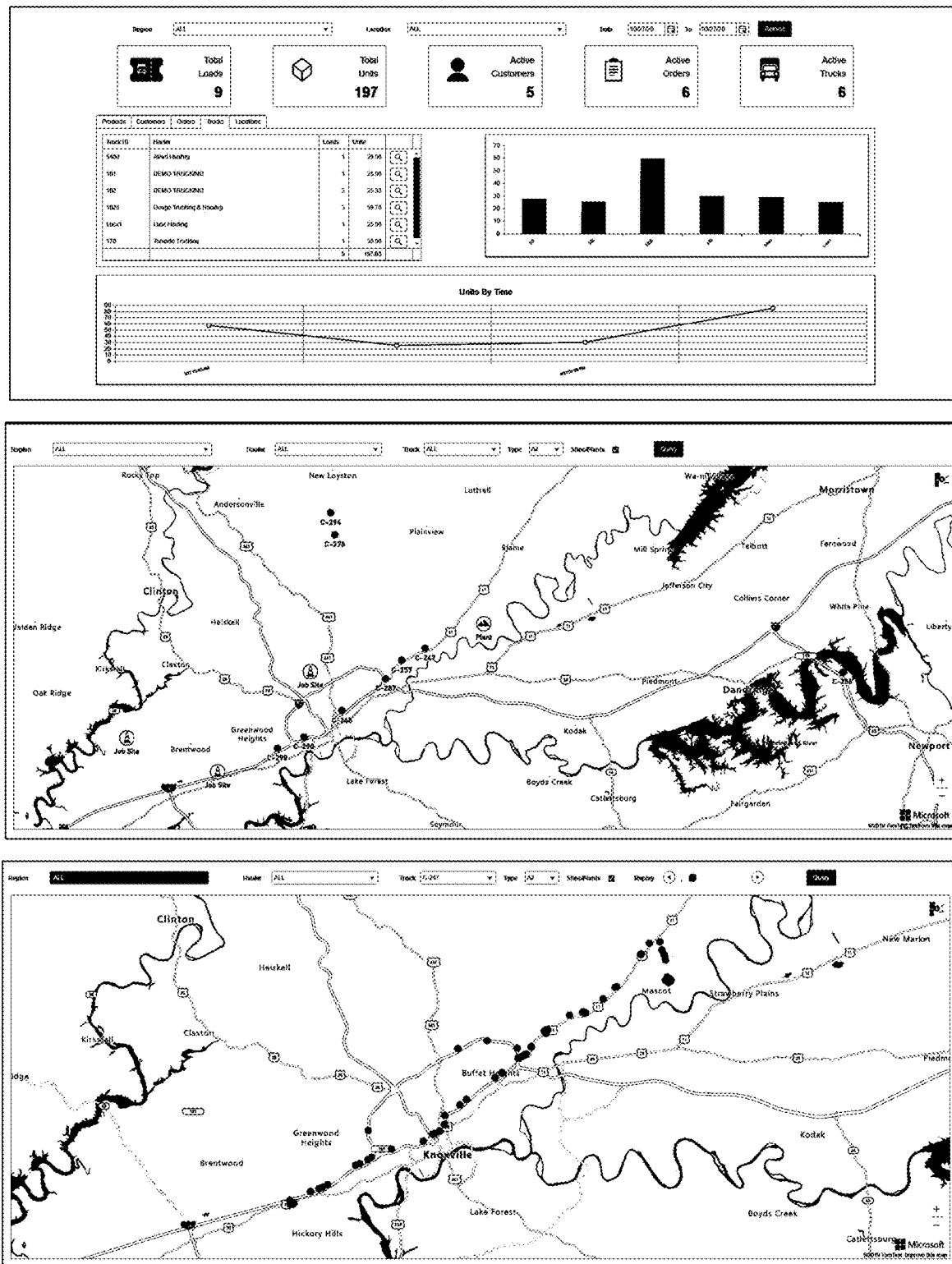
FIG. 5 shows an oversight interface of the system for tracking hauling operations according to one embodiment of the present disclosure.

Referring now to FIG. 5, the system for tracking hauling operations 10 provides oversight of a hauling operation from the loading site 12 to the worksite 14. The system 10 provides an oversight interface that is viewable by various parties, such as an owner of the hauler, an owner of the loading site, contractors, independent truckers, and other parties who may have an interest in a material being transported. The oversight interface displays information such as a truck number, status, load status, hauler identity, drive identification, phone number, destination, direction, current speed of a particular hauler, beacon identification number, and other various information. FIGS. 7-18 illustrate various embodiments of a user interface for oversight of hauling operations.

Information displayed on the various interfaces is updated in real-time or near real-time as various assets change location. Further, the system for tracking hauling operations enables information to be updated with little or no manual input from operators of assets during a hauling operation. For example, during a hauling operation a hauler 18 and attached beacon 16 enters a loading site 12 and passes a receiving unit 20 adjacent the entrance 24 to the loading site 12, and a location of the hauler 18 may be automatically updated to indicate that the hauler 18 has entered the loading site 12. An alert may optionally be sent to a loader 26 to prepare a load for the hauler 18. When the hauler 18 and beacon 16 attached to the hauler 18 are within a detectable range of the loader 26 and receiving unit 20 mounted to the loader, an operator of the loader 26 may input that an appropriate load was loaded onto the hauler 18.

The hauler 18 may proceed to a scale to be issued a weigh ticket, at which point a receiving unit 20 at the scale indicates that the hauler 18 is being issued a weigh ticket. Information from the weigh ticket may either be stored electronically or, in the alternative, information from a physical weigh ticket may be associated with the hauler 18, such as with a physical weigh ticket including a bar code. The hauler 18 may then exit the loading site 12 and a location of the hauler 18 may be updated to reflect that the hauler has departed the loading site and is en route to the worksite 14.

Information related to a location of the hauler 18 may be periodically updated as the hauler 18 transits from the loading site 12 to the worksite 14, such as with GPS or other location methods. Upon arriving at the worksite 14, a receiving unit 20 adjacent an entrance to a worksite 14 may automatically detect the beacon 16 attached to the hauler 18 and automatically update information related to the hauler 18 to reflect that the hauler 18 has reached the worksite. In one embodiment, when the beacon 16 of the hauler 18 is detected by the receiving unit 20 at the worksite 14, such as adjacent an entrance to the worksite 14, information relating to a weigh ticket for a particular load of the hauler 18 is pulled and a status of the hauler 18 is updated to reflect that the hauler 18 has delivered the load to the worksite. In an alternative embodiment, the receiving unit 20 at the worksite 14 may accept manual input. For example, it may be desirable for the receiving unit 20 to scan a weigh ticket issued to a particular hauler 18 when the hauler arrives at the worksite 14.

Figure 6:
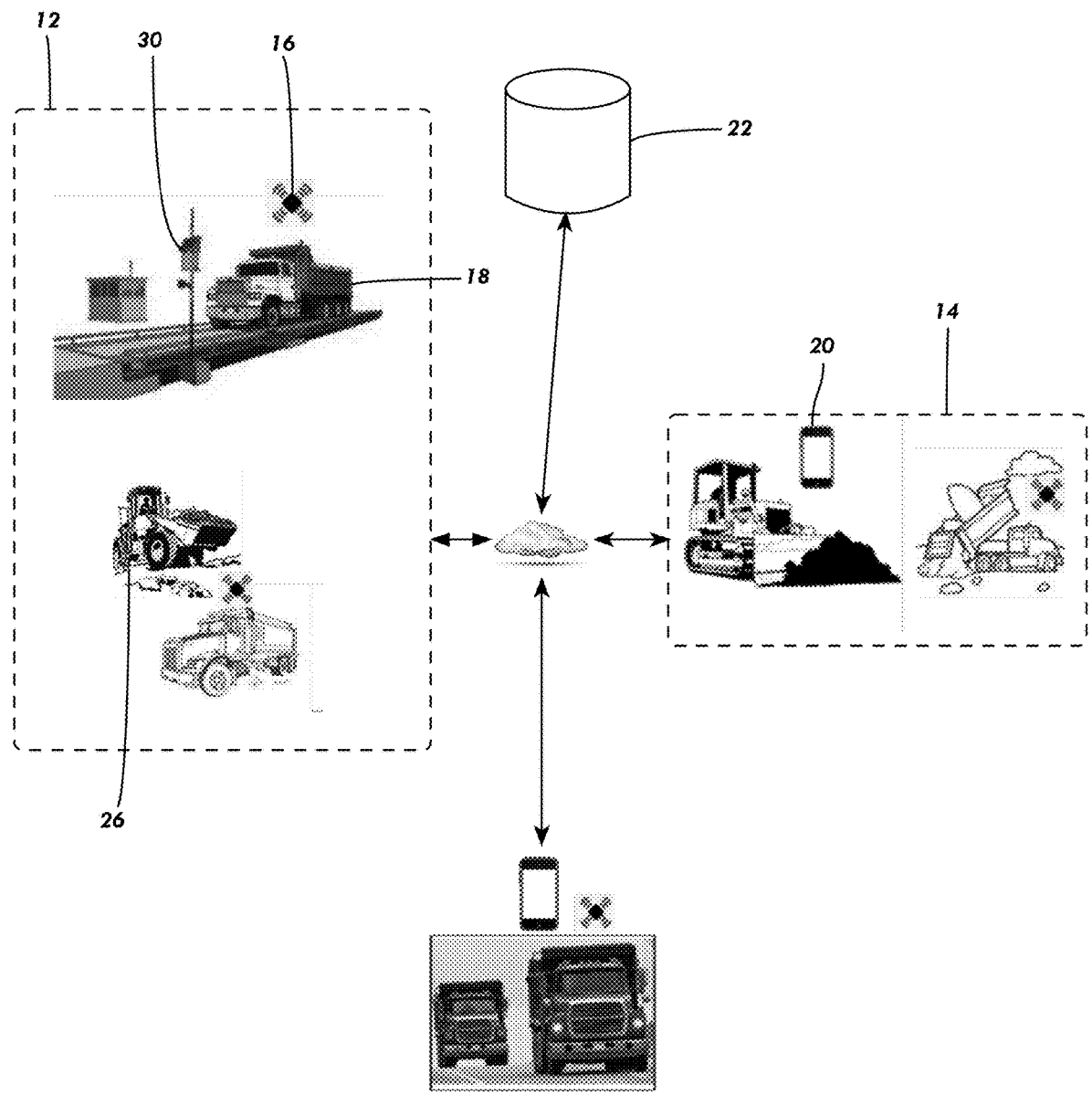
FIG. 6 illustrates a system for tracking hauling operations according to one embodiment of the present disclosure.
Figure 7:
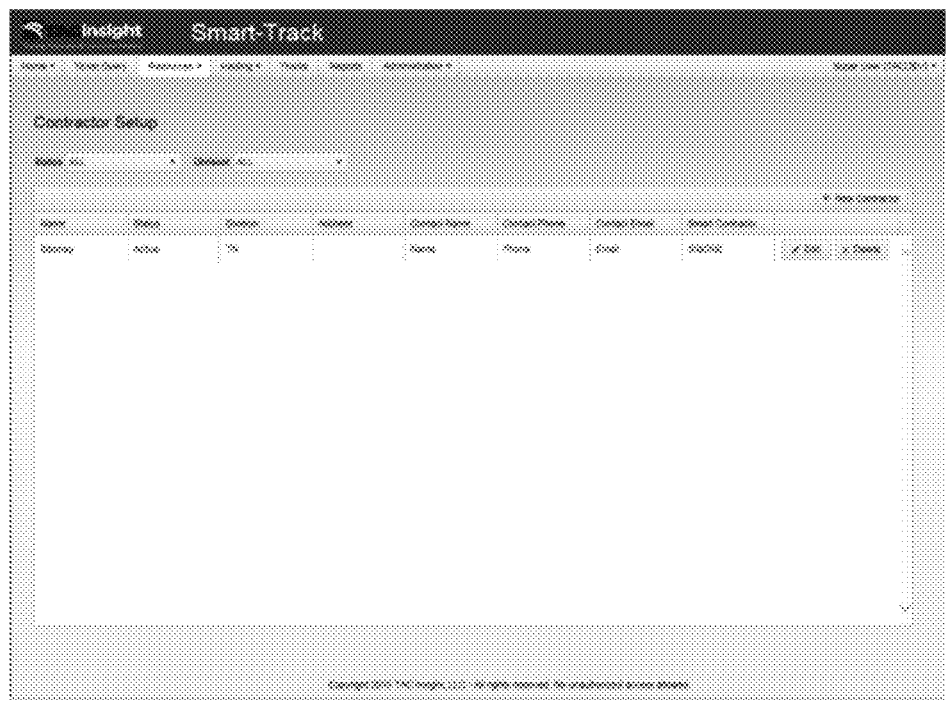
FIG. 7 shows a user interface for a contractor setup according to one embodiment of the present disclosure.
Figure 8:
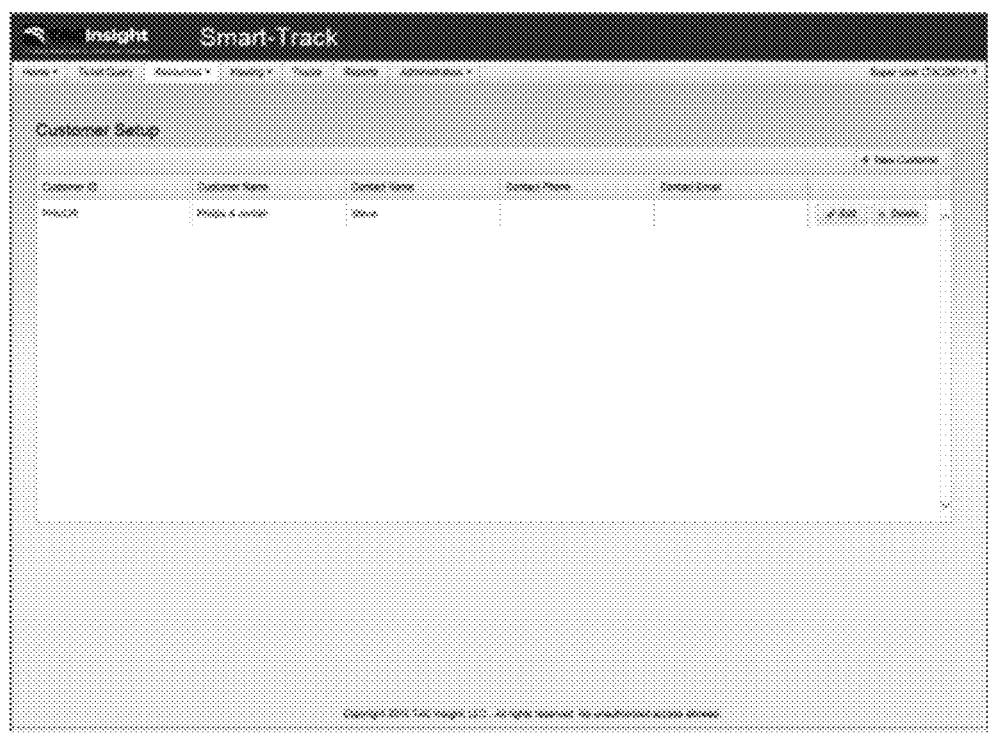
FIG. 8 shows a user interface for a customer setup according to one embodiment of the present disclosure.
Figure 9:
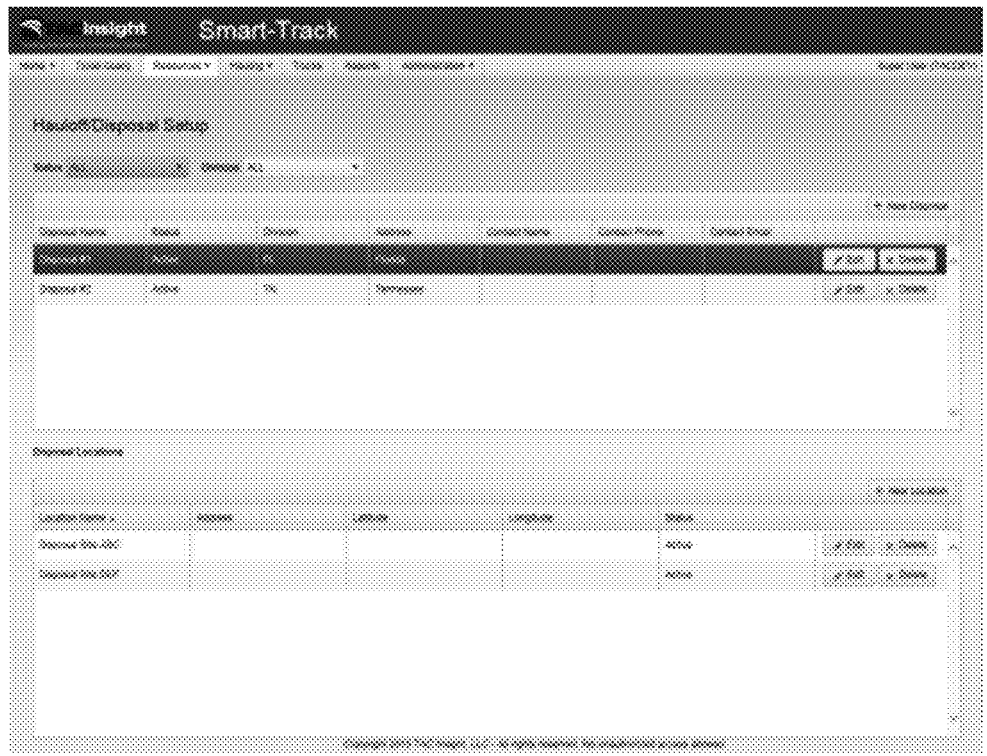
FIG. 9 shows a user interface for haul off/disposal setup according to one embodiment of the present disclosure.
Figure 10:
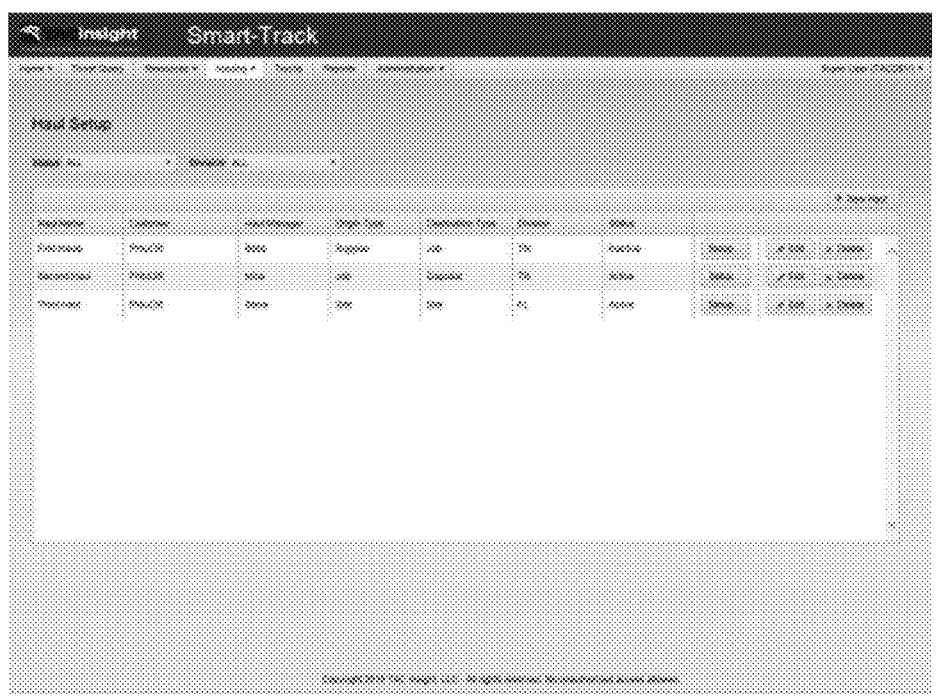
FIGS. 10 and 11 show a user interface for a haul setup according to one embodiment of the present disclosure.
Figure 11:
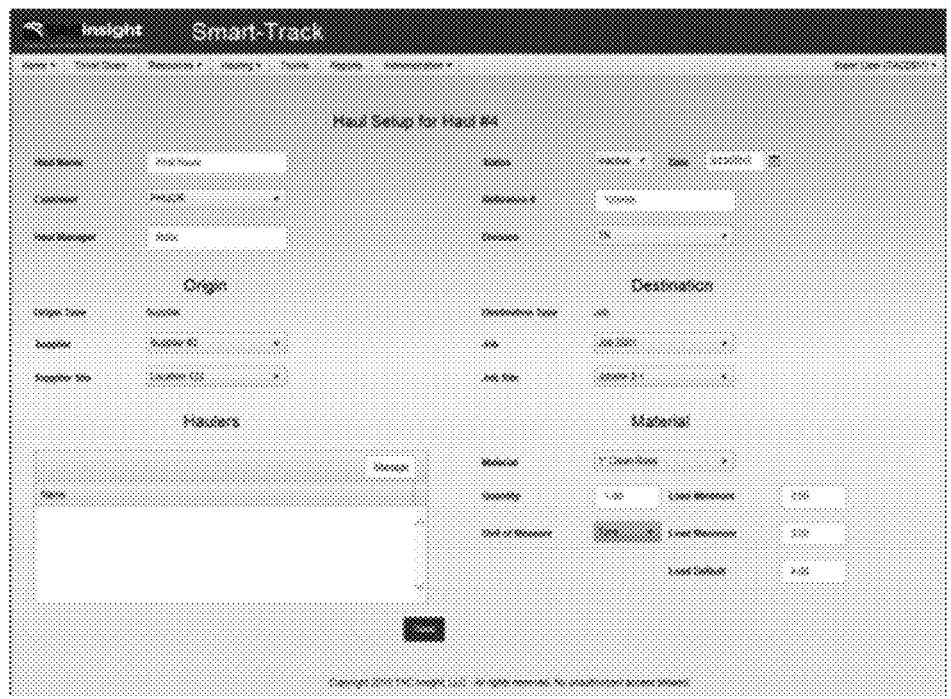
Figure 12:
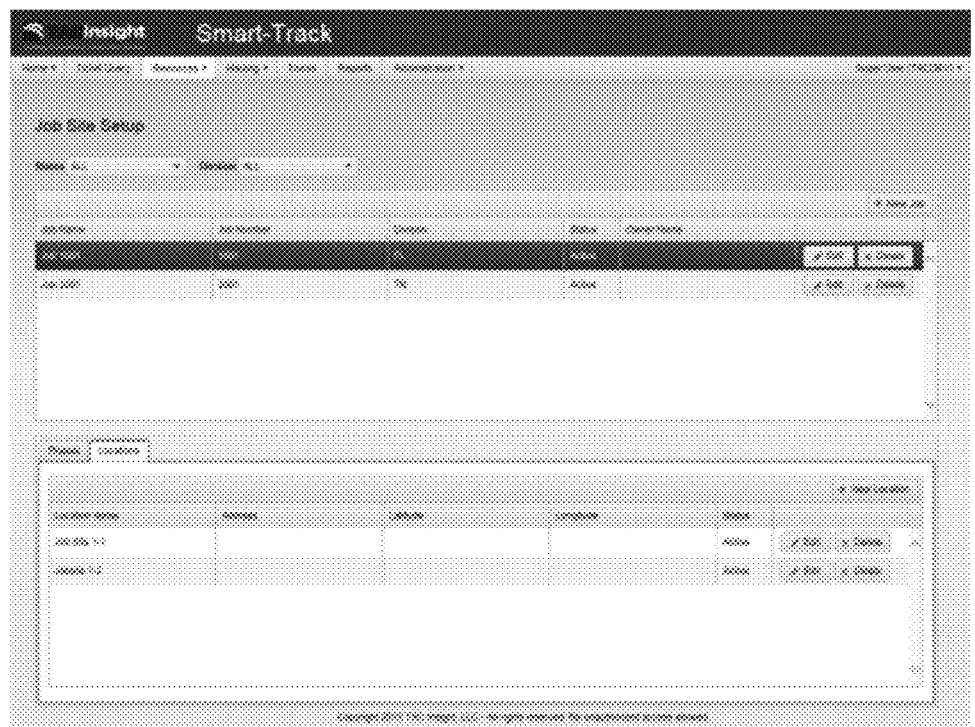
FIG. 12 shows a user interface for a job site setup according to one embodiment of the present disclosure.
Figure 13:
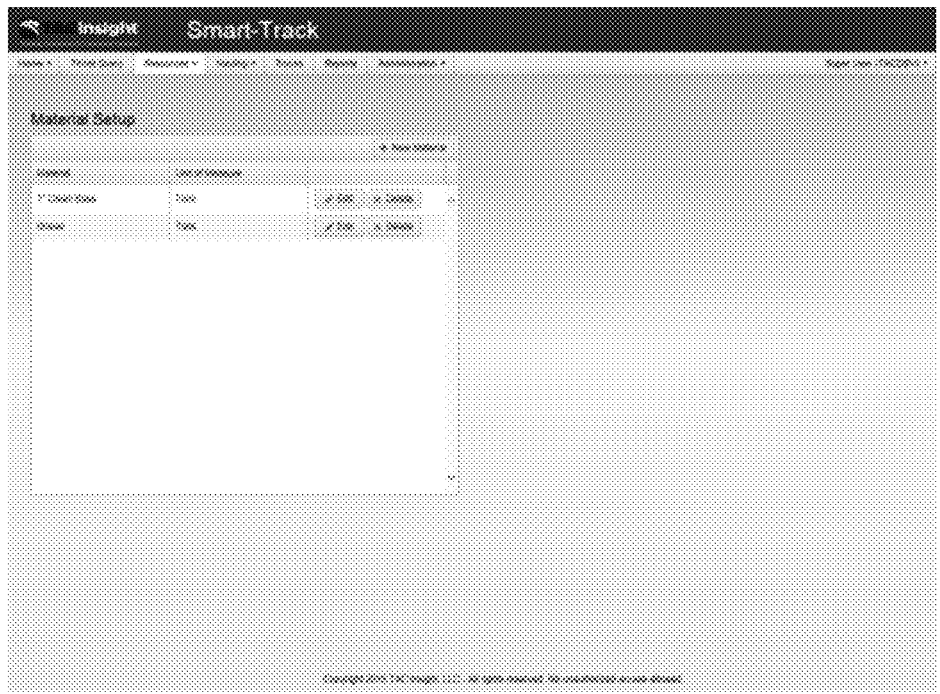
FIG. 13 shows a user interface for a material setup according to one embodiment of the present disclosure.
Figure 14:
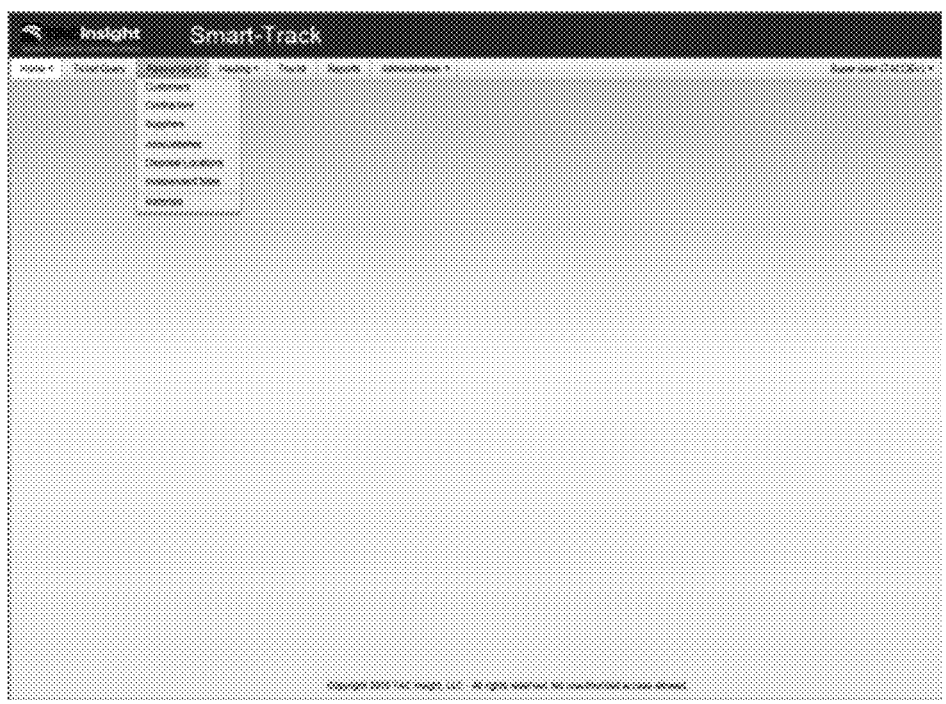
FIG. 14 shows menus of a user interface according to one embodiment of the present disclosure.
Figure 15:
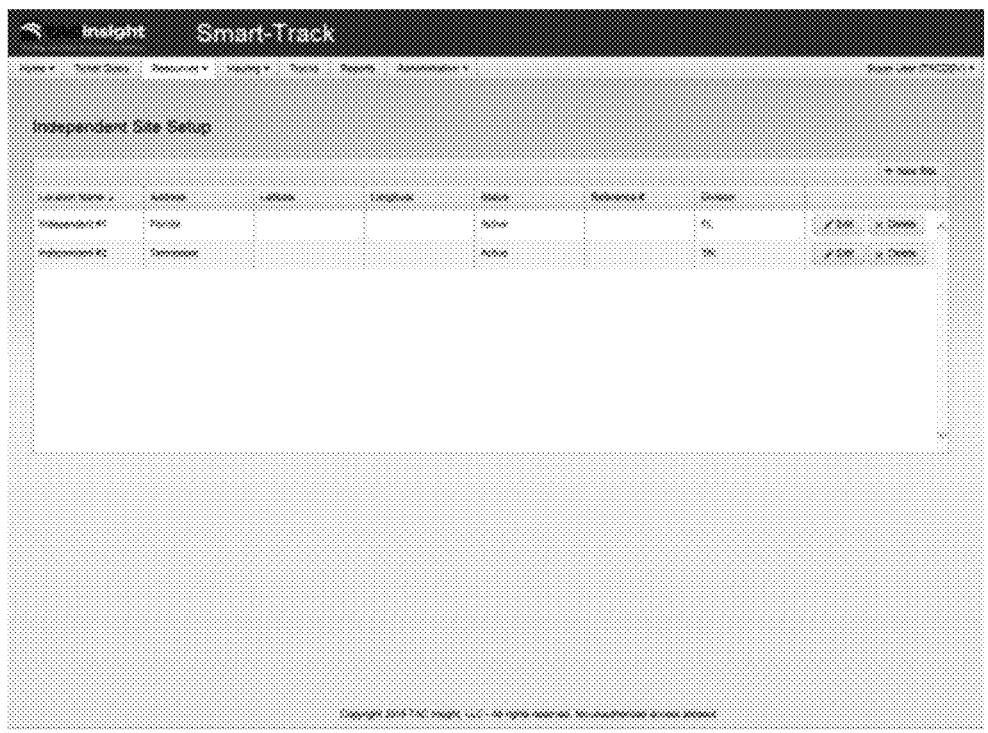
FIG. 15 shows a user interface for an independent site setup according to one embodiment of the present disclosure.
Figure 16:
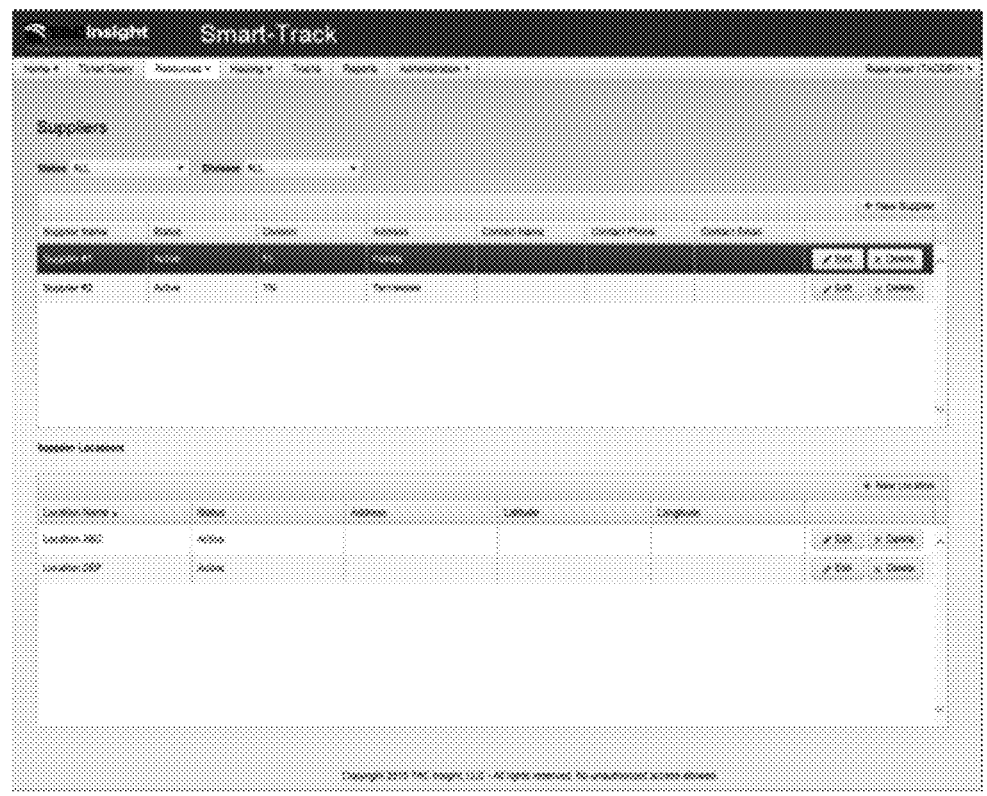
FIG. 16 shows a user interface for a list of suppliers according to one embodiment of the present disclosure.
Figure 17:
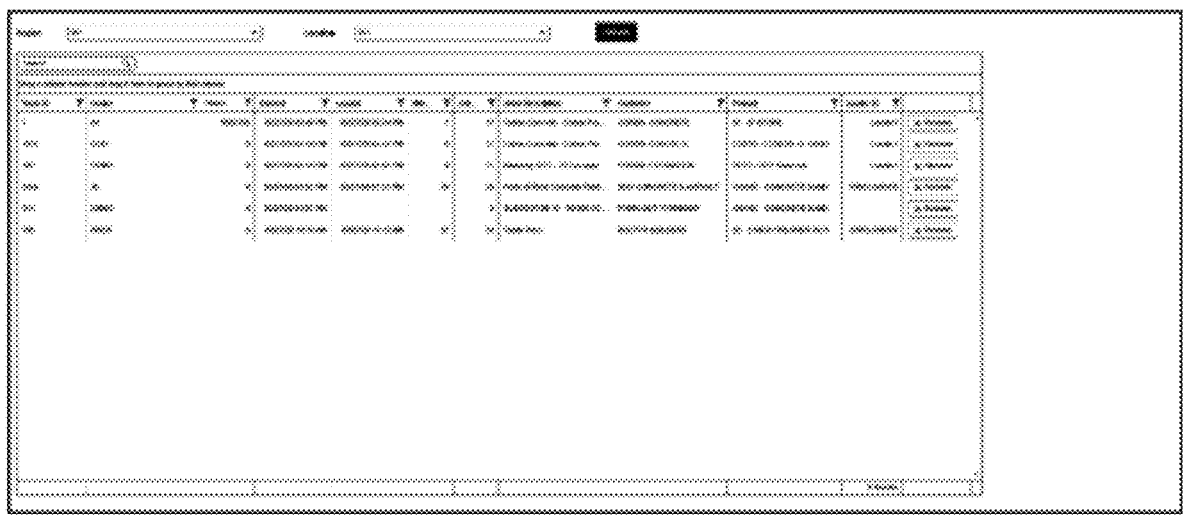

Referring to FIG. 6, in operation the system for tracking hauling operations may be readily deployed at a desired loading site with the installation of minimal components that would allow tracking of a hauler and loader within the loading site. To install the system, one or more beacons 16 are mounted to the one or more haulers 18. A receiving unit 20 is mounted inside of a cab of one or more of the loaders. The receiving unit 20 is preferably a network-connected smart phone or tablet including an integrated module configured to detect and analyze a low energy transmission, such as a Bluetooth® LE transmission. Therefore, in this example the only component required to be installed on the loader for detecting a beacon mounted to a hauler is the receiving unit, and no additional tag readers, antennas, or other components are required.

A receiving unit 20 may also be installed at the loading site as a freestanding kiosk 30. The freestanding kiosk 30 is also connected to a network and includes a module configured to detect and analyze the low energy transmission emitted by the beacon 16. The freestanding kiosk 30 may be communicable with the network using a wireless connection, such as a cellular connection, and therefore may only require a power source for installation at a loading site. The freestanding kiosk 30 and other receiving units may, in some embodiments, not be network-connected and instead may store data collecting by the receiving units locally until a network connection is achieved.

In operation, the receiving units detect a low energy transmission from the beacon 16 in proximity to the receiving unit and analyze the detected transmission to determine the unique identification code broadcasted from the beacon. In one embodiment, the receiving unit also detects a strength of the low energy transmission, and may only determine that a beacon 16 is in proximity to the receiving unit if the detected transmission is above a designated threshold. The receiving unit transmits data related to the detected transmission to the database, where an identity of a hauler is determined based on the beacon detected by the receiving unit.

A status of the hauler may be stored on the database and associated with a particular hauler and its attached beacon. For example, when a receiving unit adjacent an entrance to a loading site detects the beacon as being in proximity, the status of the hauler may be updated to reflect that the hauler has entered the loading site. The database may transmit the hauler status to a display mounted in a loader such that an operator of the loader may view any haulers that have been identified as entering the loading site, and may also transmit information related to the hauler such as a type of material to be loaded, quantity, and other information for the particular hauler.

A list of haulers that have entered the loading site are displayed on the display mounted to the loader. When a receiving unit mounted to the loader detects the low energy transmission from a beacon of one of the haulers, the detected hauler and corresponding information are displayed on the display mounted in the loader. The display may include an interactive user interface, such that when a loader has completing loading the hauler, the operator may enter an input that the hauler is loaded. This input is transmitted to the database and a status of the hauler is changed to indicate that the hauler is now loaded.

In the event that multiple haulers are detected as having entered a loading site, only those haulers that are detected as being in proximity to the loader may be displayed at a top of a list of haulers displayed on the display. If multiple haulers are detected as being in proximity, the list may be sorted based on proximity of the haulers to the loader, such that the operator may determine which haulers are closest to the loader.

After being designated as loaded, an electronic weigh ticket may be transmitted to a receiving unit of the hauler, the weigh ticket including information related to material loaded in the hauler. The electronic weigh ticket may also be transmitted to the database and associated with the particular hauler.

When the hauler passes a receiving unit adjacent an exit of the loading site, the detected transmission of the beacon on the hauler is transmitted to the database and a status of the hauler is updated to reflect that the hauler has departed the loading site. A location of the hauler may be monitored using GPS or other technology such that the status of the hauler may reflect a geographic location of the hauler between the loading site and work site.

A receiving unit located adjacent an entrance to the work site may detect the low energy transmission of the beacon mounted to the hauler, and the detected emission and identification code may be transmitted to the database wherein a status of the hauler may be updated to indicate that the load being transported by the hauler has been delivered.

The system for tracking hauling operations advantageously reconciles data related to a hauling operation, such as location information, loading, transit, weigh ticketing, and other related information. The system reconciles and updates information related to a loading operation with little manual input required from operators, such as by automatically updating a location or status of a hauler based on a beacon of a hauler being detected within range of a receiving unit. The system allows users to track progress of an overall hauling operation involving multiple haulers, loaders, worksites, loading sites, and weigh tickets. The system also reduces the opportunity for fraud during a hauling operation by providing updated information and confirmation of various steps throughout the hauling operation.

Further, the system for tracking hauling operations also enables tracking of hauling operations without requiring substantial infrastructure at a loading site or worksite. For example, as described above, various portable devices may be used as receiving units, such as smartphones, for communicating with the database. The database may be located remotely from a particular worksite or loading site, such as a cloud-based database. Because minimal infrastructure is required at a worksite or a loading site, the system for tracking hauling operations is readily operable as worksites or loading sites that may be remote or otherwise lack utilities that would ordinarily be necessary for various infrastructure components such as a local network or other various hardware components. Further, the system for tracking hauling operations is readily installed at various locations for tracking transportation of a load from one location to another and matching that information to other information such as weigh ticket data.

Yet another advantage of the system for tracking hauling operations is the ability to track and monitor multiple haulers within a loading site, between the loading site and work site, and upon delivery at the work site. The system enables a loader operator to view multiple haulers that have entered the loading site, and to view only those haulers that are detected as being in proximity to the loader. Further, if multiple haulers are in proximity, they may be displayed to the loader operator in order of proximity.

The foregoing description of preferred embodiments of the present disclosure has been presented for purposes of illustration and description. The described preferred embodiments are not intended to be exhaustive or to limit the scope of the disclosure to the precise form(s) disclosed. Obvious modifications or variations are possible in light of the above teachings. The embodiments are chosen and described in an effort to provide the best illustrations of the principles of the disclosure and its practical application, and to thereby enable one of ordinary skill in the art to utilize the concepts revealed in the disclosure in various embodiments and with various modifications as are suited to the particular use contemplated. All such modifications and variations are within the scope of the disclosure as determined by the appended claims when interpreted in accordance with the breadth to which they are fairly, legally, and equitably entitled.

What is claimed is:

1. A method of tracking hauling operations within a loading site, the method comprising the steps of:
    mounting a beacon to a hauler, the beacon including a transmitter configured to emit a low energy transmission including a unique identification code embedded in the low energy transmission, the unique identification code corresponding to the beacon;
    providing at least a first receiving unit at the loading site, the first receiving unit having a processor and configured to detect the low energy transmission emitted by the beacon mounted to the hauler;
    detecting with the first receiving unit the low energy transmission emitted by the beacon when the hauler and mounted beacon are within range of the first receiving unit;
    analyzing the detected transmission emitted by the beacon mounted to the hauler with the processor of the at least first receiving unit to determine the unique identification code transmitted by the beacon;
    identifying with a processor the hauler based on the embedded unique identification code of the detected transmission;
    providing a display mounted in a cab of a loader operating within the loading site;
    in response to detecting with the first receiving unit the low energy transmission emitted by the beacon when the hauler and mounted beacon are within range of the first receiving unit, displaying the status of the hauler on the display mounted in the cab of the loader
    providing a user interface on the display mounted in the cab of the loader, the user interface configured to receive user input from an operator of the loader;
    displaying a list of haulers on the display mounted in the cab of the loader that have a status indicating the haulers are located within the loading site;
    analyzing the detected transmission emitted by the beacon mounted to the hauler with the at least first receiving unit to measure a strength of the detected transmission and calculate a distance to the beacon;
    filtering the list of haulers displayed on the loader to include only those haulers that are within a desired range of the loader;
    receiving user input on the display mounted to the cab of the loader from the operator of the loader;
    transmitting the user input received on the display mounted in the cab of the loader from the operator of the loader to a database; and
    changing a status of a hauler based on the received operator input to designate that the hauler has been loaded by the loader.

2. The method of claim 1, further comprising:
    assigning a status position to the hauler based on a location of the hauler and
    changing a status of the hauler to a designation that the hauler is located within the loading site when the at least first receiving unit detects the low energy transmission emitted by the beacon mounted to the hauler.

3. The method of claim 1, further comprising sorting the list of haulers displayed on the display of the loader based on a determined distance of each hauler from the loader.

4. The method of claim 1, further comprising: recording information related to a time and date of receiving operator input related to a loading.

5. The method of claim 4, further comprising receiving load input from the operator through the user interface of the display mounted on the cab of the loader, the load input corresponding to an amount and type of material loaded by the loader into the hauler.

6. The method of claim 5, further comprising receiving an electronic load ticket on a hauler device, the electronic load ticket including information related to an identity of the hauler and load input received from the operator of the loader.

7. The method of claim 4, further comprising receiving user input from an operator of the loader such that the hauler status is updated to reflect that the hauler has departed the loader and is en route to a delivery site.

8. The method of claim 2, further comprising updating a status of a hauler to reflect that the hauler has departed the loading site for a delivery site when the at least first receiving unit detects the low energy transmission emitted by the hauler beacon for at least a second time.

9. The method of claim 8, further comprising:
    providing a GPS unit mounted to the hauler;
    transmitting a location of the hauler between the loading site and the delivery site.

10. The method of claim 6, further comprising:
    providing a second receiving unit at a delivery site, the second receiving unit configured to detect the low energy transmission emitted by the beacon mounted to the hauler;

detecting with the second receiving unit the low energy transmission emitted by the beacon when the hauler and mounted beacon are within range of the first receiving unit; and updating a status of the hauler to reflect that the load transported by the hauler has been delivered to the delivery site.

11. The method of claim 10, further comprising receiving an updated electronic load ticket on the hauler device reflecting that the load has been delivered.

12. A method of tracking hauling operations within a loading site, the method comprising the steps of:
providing a hauler tracking database in communication with a network;
storing data on the hauler tracking database related to an identity of a hauler;
storing a unique identification code on the database associated with the hauler, the unique identification code corresponding to a beacon mounted to the hauler that is configured to actively emit a low energy transmission including the unique identification code embedded in the low energy transmission;
receiving an arrival transmission on the hauler tracking database from one or more receiving units located at a loading site and in electronic communication with the network, the arrival transmission including the unique identification code emitted by the beacon;
determining with a processor an identity of the hauler based on the unique identification code received on the hauler tracking database;
storing a status of the hauler on the hauler tracking database indicating that the hauler is located at a loading site;
transmitting the status and identifying information of the hauler over the network to a display of a loader receiving unit mounted to a loader at the loading site;
receiving a load transmission on the hauler tracking database from the loader receiving unit including the unique identification code and indicating that the hauler has been loaded by the loader;
providing a display mounted to a cab of a loader operating within the loading site;
displaying the status of the hauler on the display mounted to the cab of the loader providing a user interface on the display mounted to the cab of the loader, the user interface configured to receive user input;
displaying a list of haulers on the display mounted in the cab of the loader that have a status indicating the haulers are located within the loading site;
analyzing the detected transmission emitted by the beacon mounted to the hauler with the at least first receiving unit to measure a strength of the detected transmission and calculate a distance to the beacon;
filtering the list of haulers displayed on the loader to include only those haulers that are within a desired range of the loader;
receiving user input on the display mounted to the cab of the loader from an operator of the loader;
updating with a processor the status of the hauler on the hauler tracking database based on the received operator input on the display mounted to the cab of the loader indicating that the hauler has been loaded;

receiving a departure transmission on the hauler tracking database from the one or more receiving units, the departure transmission including the unique identification code emitted by the beacon; and updating with a processor the status of the hauler on the hauler tracking database indicating that the hauler has departed the loading site.

13. The method of claim 12, further comprising generating an electronic load ticket on the hauler tracking database based on data received from the loader receiving unit and transmitting the electronic load ticket to a hauler device.

14. The method of claim 12, further comprising:
receiving a delivery site arrival transmission on the hauler tracking database from one or more receiving units located at a delivery site, the delivery site transmission including the unique identification code emitted by the beacon;
updating the status of the hauler on the hauler tracking database indicating that the hauler has arrived at the delivery site.

15. The method of claim 14, further comprising receiving location data corresponding to a location of the hauler as the hauler travels between the loading site and delivery site.

16. A system for tracking hauling operations at a loading site comprising:
a beacon mounted to a hauler, the beacon including a transmitter configured to actively emit a low energy transmission including a unique identification code embedded in the low energy transmission;
a display mounted to a cab of a loader operating within the loading site, the display showing a status of the hauler and including a user interface configured to receive user input from an operator of the loader and showing a list of haulers that have a status indicating the haulers are located within the loading site;
at least a first receiving unit located at the loading site, the first receiving unit including a receiver element for detecting a low energy transmission emitted from the beacon;
a database in communication with the at least first receiving unit, the database configured to store data related to the beacon and the hauler, the database further configured to association data related to the beacon and the hauler with weigh ticket information for a particular load transported by the hauler;
wherein data stored on the database is updated when the beacon attached to the hauler is detected by one of the plurality of receiving units; and
wherein a status of a hauler is changed based on the received operator input from the display mounted to the cab of the loader to designate that the hauler has been loaded by the loader;
wherein a detected transmission emitted by the beacon mounted to the hauler by the at least first receiving unit is analyzed to measure a strength of the detected transmission and calculate a distance to the beacon; and
wherein a list of haulers displayed on the loader is filtered to include only those haulers that are within a desired range of the loader.

17. The system of claim 16, wherein the low energy transmission emitted from the beacon comprises a Bluetooth® LE transmission.

* * * * *